(12) United States Patent
Gerbsch et al.

(10) Patent No.: US 7,423,332 B2
(45) Date of Patent: Sep. 9, 2008

(54) VERTICAL LAMINATED ELECTRICAL SWITCH CIRCUIT

(75) Inventors: Erich W. Gerbsch, Cicero, IN (US); Monty B. Hayes, Kokomo, IN (US); Robert J. Campbell, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 1072 days.

(21) Appl. No.: 10/647,981

(22) Filed: Aug. 26, 2003

(65) Prior Publication Data

US 2005/0047186 A1 Mar. 3, 2005

(51) Int. Cl.
*H01L 23/02* (2006.01)
*H02B 1/00* (2006.01)

(52) U.S. Cl. .......... 257/678; 257/700; 257/734; 257/748; 257/750; 257/E29.001; 257/E29.043; 361/600; 361/190

(58) Field of Classification Search ........... 257/107, 257/678, 700, 703, 734, 748, 750, E29.001, 257/E29.043, E29.327, E25.014, E25.015, 257/E25.024, E23.009, E23.062, E23.106, 257/E23.118, E23.173; 361/2, 189, 190, 361/600, 321.2

See application file for complete search history.

(56) References Cited

U.S. PATENT DOCUMENTS

| 5,498,948 | A | | 3/1996 | Bruni et al. |
| 5,513,382 | A | * | 4/1996 | Agahi-Kesheh et al. ....... 455/83 |
| 5,990,732 | A | * | 11/1999 | Furutani et al. ............. 327/565 |
| 6,384,355 | B1 | | 5/2002 | Murphy et al. |
| 6,831,528 | B2 | * | 12/2004 | Nagata et al. ............... 333/101 |
| 6,849,924 | B2 | * | 2/2005 | Allison et al. ............... 257/635 |

* cited by examiner

*Primary Examiner*—Jasmine J Clark
(74) *Attorney, Agent, or Firm*—Jimmy L. Funke

(57) ABSTRACT

A vertical laminated electrical switch circuit includes a first, second, and third ceramic substrate positioned in juxtaposed relationship relative to each other. The circuit also includes a first and second electrical device electrically coupled to each other. The first electrical device is coupled to the first and second substrates and positioned there between. The second electrical device is coupled to the second and third ceramic substrates and positioned there between. In some embodiments, multiple electrical devices may be coupled to a single substrate.

21 Claims, 6 Drawing Sheets

US 7,423,332 B2

VERTICAL LAMINATED ELECTRICAL SWITCH CIRCUIT

TECHNICAL FIELD

The present disclosure generally relates to the fabrication of electrical devices. In particular, the present disclosure relates to the fabrication of electrical switch circuits.

BACKGROUND OF THE INVENTION

Electrical switch circuits are used in many applications including amplification, power, and inverter circuits. In particular, electrical switch circuits are typically used in phase switch modules. Phase switch modules are used in many applications, such as electric motor drives for industrial or automotive application to convert a direct current (hereinafter sometimes D.C.) signal to an alternating current (hereinafter sometimes A.C.) signal. Depending upon the number of electrical switch circuits in the phase switch module, a single or multiple phase switch circuit can be designed.

A typical electrical switch circuit 100 is shown schematically in FIG. 9. The switch circuit 100 includes a first and second electrical device 102, 104, respectively. In the embodiment illustrated in FIG. 9, the devices 102, 104 are transistors. In particular, the devices 102, 104 may be, for example, Metal Oxide Semiconductor Field-Effect Transistors (hereinafter sometimes MOSFET), Insulated Gate Bipolar Transistors (hereinafter sometimes IGBT) with an antiparallel diode or the like. The devices 102, 104 illustrated in FIG. 9 are configured in a half-bridge electrical configuration. A supply terminal 106 is coupled to the drain/collector (MOSFET/IGBT) of the first electrical device 102. The source/emitter of the first device 102 is coupled to the drain/collector of the second device 104. An output terminal 108 is also coupled to the source/emitter of the first device 102 and the drain/collector of the second device 104. A reference terminal 110 (e.g., ground potential) is coupled to the source/emitter of the second device 104. Switching terminals 112, 114 are separately coupled to the gates of the devices 102, 104 through gate resistors 116, 118, respectively. Additionally, diodes 120, 122 are coupled across the drain/collector and the source/emitter of the devices 102,104, respectively. In applications using MOSFET devices, the diodes 120, 122 may be either the body diode of the MOSFET or an additional diode.

A periodic full-wave, single phase A.C. drive signal is created on the output terminal 108 by switching the devices 102, 104. The devices 102, 104 are switched on by applying a trigger voltage to the terminals 112, 114, respectively. When the first device 102 is switched on, the second device 104 is switched off and the output terminal 108 is coupled to the supply terminal 106 through the first device 102. Conversely, when the second device 104 is switched on, the first device 102 is switched off and the output terminal 108 is coupled to the reference terminal 110 through the second device 104. Through the proper switching of devices 102 and 104 between the positive supply terminal 106 and the reference terminal 110, and by properly modulating each device's duty-cycle, the waveform created on the output terminal 108 is a positive full-wave, single phase drive signal.

A three phase A.C. drive signal can be created in a known manner by the cooperation of three electrical switch circuits 100A, 100B, and 100C as illustrated schematically in FIG. 10. The drains/collectors of the first transistor 102A of each circuit 100A, 100B, 100C are coupled together to a positive supply terminal 106A. Similarly, the sources/emitters of the second transistor 104A of each circuit 100A, 100B, 100C are coupled together to a reference terminal 110A. A full-wave, three phase A.C. drive signal can be created by triggering each circuit 100A, 100B, 100C at alternating times. Separate full-wave, single phase drive signals are created at each output terminal 108A, 108B, 108C. Each of the three full-wave, single phase drive signals is 120° out of phase with each other. When combined, the three full-wave, single phase A.C. drive signals create a full-wave, three phase A.C. drive signal.

A typical phase module may include one or more of the circuits illustrated in FIG. 9 and FIG. 10. In particular, some phase modules include a plurality of switch circuits 100 coupled in parallel configuration so as to increase the current capability of the phase module. The phase modules generally use a planar geometry distribution for the electrical devices of the circuits 100 in which the electrical devices are positioned on the same plane. Positioning the electrical devices on the same plane generally increases the footprint of the phase module and may require sophisticated wiring techniques such as wire bonding and laser welding. In some phase module applications, for example electric motor vehicle applications, the size and ease of manufacturability of the phase modules are important considerations.

SUMMARY OF THE INVENTION

In accordance with one illustrative embodiment, an electrical switch circuit includes a first, second, and third ceramic substrate positioned in juxtaposed relationship relative to each other. The electrical switch circuit also includes a first electrical device coupled to the first and second substrates and a second electrical device coupled to the second and third substrates. The first electrical device is positioned between the first and second substrates. The second electrical device is positioned between the second and third substrates and is electrically coupled to the first electrical device.

In accordance with another illustrative embodiment, a three phase inverter includes a first, second, and third ceramic substrate positioned in juxtaposed relationship relative to each other. The inverter also includes a first, second, third, fourth, fifth, and sixth transistor. The first transistor is coupled to the first and second substrates and positioned there between. The second transistor is coupled to the second and third substrates and positioned there between. The first and second transistors are electrically coupled together in a half-bridge electrical configuration. The third transistor is coupled to the first and second substrates and positioned there between. The fourth transistor is coupled to the second and third substrates and positioned there between. The third and fourth transistors are electrically coupled together in a half-bridge electrical configuration. The fifth transistor is coupled to the first and second substrates and positioned there between. The sixth transistor is coupled to the second and third substrates and positioned there between. The fifth and sixth transistors are electrically coupled together in a half-bridge electrical configuration.

These and other features of the present invention will become more apparent from the following description of the illustrative embodiments.

DESCRIPTION OF THE ILLUSTRATIVE EMBODIMENTS

Figure 1:
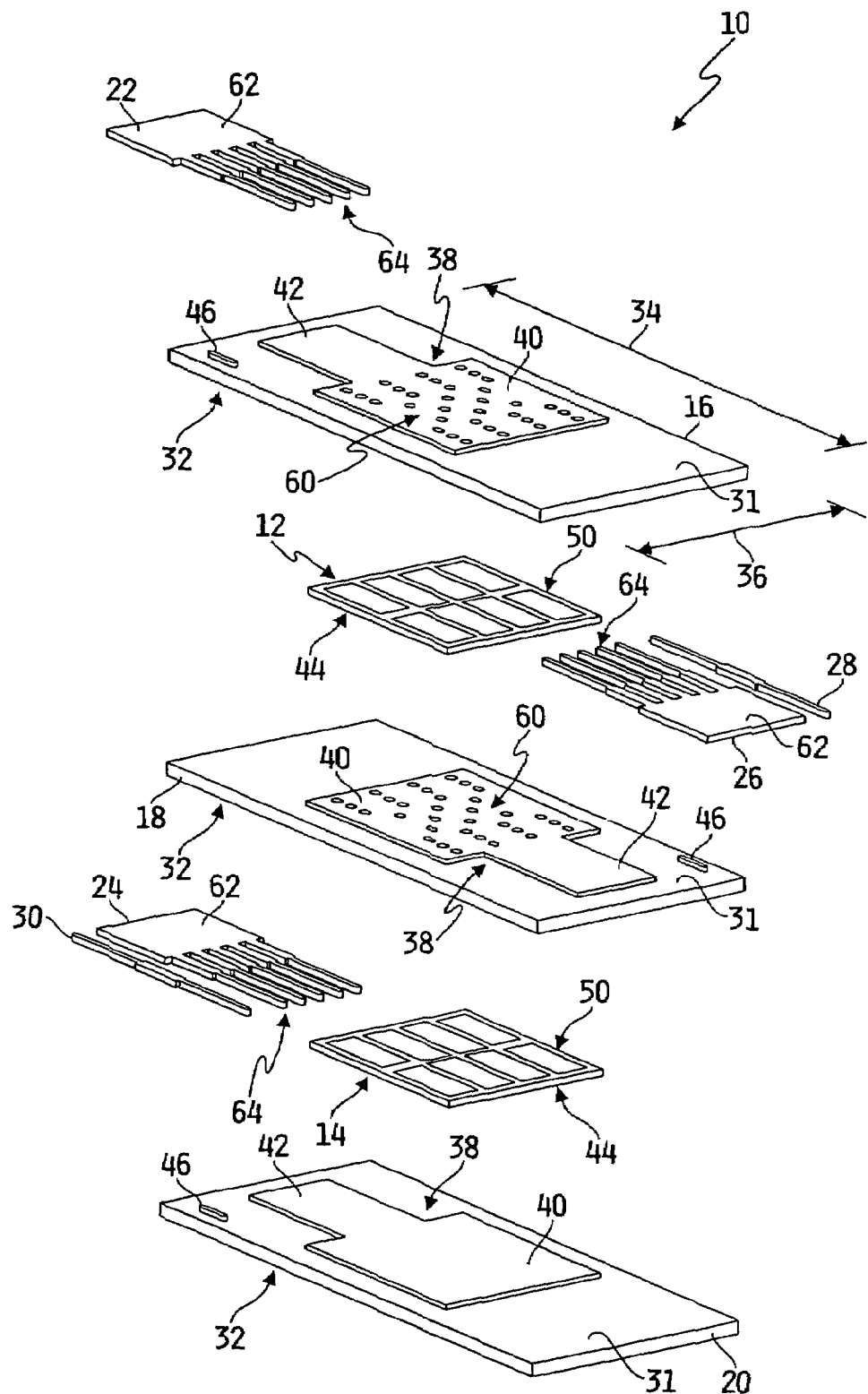
FIG. 1 is an exploded diagrammatic top perspective view of one embodiment of an electrical switch circuit.
Figure 2:
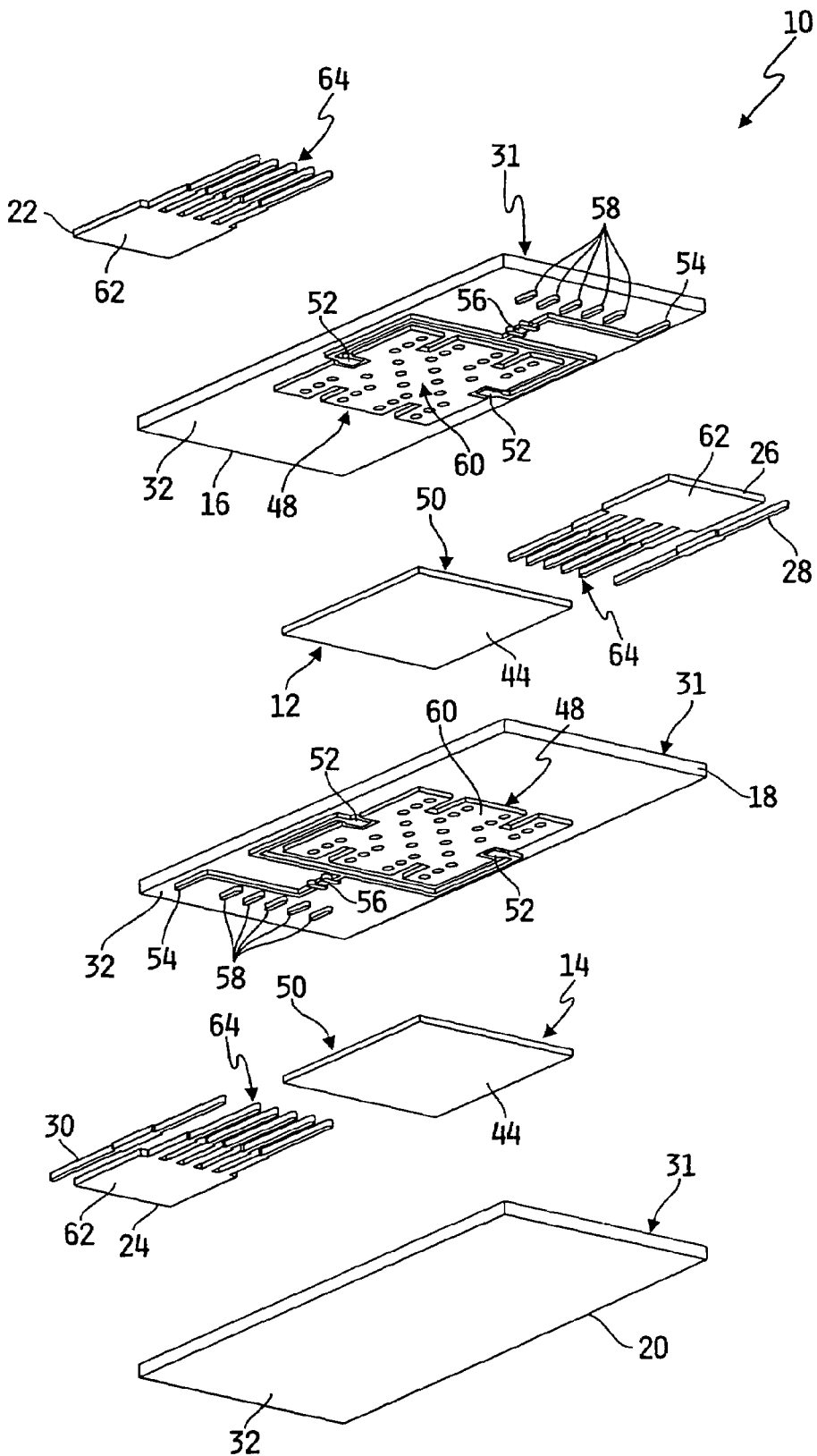
FIG. 2 is an exploded diagrammatic bottom perspective view of the electrical switch circuit of FIG. 1.

As illustrated in FIGS. 1 and 2, one embodiment of a vertically laminated electrical switch circuit 10 includes a first electrical device 12 coupled to a first substrate 16 and a second substrate 18. The circuit 10 also includes a second electrical device 14 coupled to the second substrate 18 and a third substrate 20. The devices 12, 14 are also electrically coupled to each other in a half-bridge electrical configuration. The substrates 16, 18, 20 are positioned in juxtaposed relationship relative to each other so as to form a vertical stack. The first electrical device 12 is positioned between the first substrate 16 and the second substrate 18. The second electrical device 14 is positioned between the second substrate 18 and the third substrate 20. A first supply terminal 22 is coupled to the first substrate 16 and electrically coupled to the first electrical device 12. A second supply terminal 24 is coupled to the second substrate 18 and electrically coupled to the second electrical device 14. An output terminal 26 is coupled to the first and second substrates 16, 18 and electrically coupled to the devices 12, 14. The switch circuit 10 also includes a gate pin 28 coupled to the first and second substrates 16, 18 and a second gate pin 30 coupled to the second and third substrates 18, 20. The gate pins 28, 30 are also electrically coupled to the devices 12, 14, respectively. The physical and electrical connections of the electrical switch circuit 10 may be formed by one of a number of attachment processes such as a soldering reflow process. A full-wave, single phase power signal is formed on the output terminal 26 by applying a potential across the supply terminals 22, 24 and applying a trigger voltage to the gate pins 28, 30 in an alternating pattern.

The electrical devices 12, 14 are, in the illustrated embodiment, silicon integrated circuits each having a top surface 50 and a bottom surface 44. In the embodiment illustrated in FIGS. 1 and 2, the devices 12, 14 are transistors such as, for example, Insulated Gate Bipolar Transistors or Metal Oxide Semiconductor Field Effect Transistors, or the like. However, in other applications the electrical devices 12, 14 may be diodes, smart power devices, thermistors, or other electrical components. The electrical devices 12, 14 include a number of gate terminals and source/emitter terminals on the top surface 50. The electrical devices 12, 14 also include a drain/collector terminal substantially covering the bottom surface 44. The gate, drain/collector, source/emitter terminals of the devices 12, 14 are wetable terminal areas formed from a metallic material capable of receiving a solder film such as copper or nickel-gold alloy. When the devices undergo a reflow process, the wetable terminal areas are physically and electrically coupled to other wetable terminal areas by the solder alloy film. Utilizing wetable terminal areas may improve the manufacturability of the electronic switch circuit 10 by decreasing the complexity and time to fabricate the switch circuit 10.

In the embodiment illustrated in FIG. 1, the substrates 16, 18, 20 are substantially identical in design and are formed from rectangular ceramic panels having a top surface 31 and a bottom surface 32. The substrates 12, 14, 16 have an length of about 30.71 millimeters, as illustrated by arrow 34, and a width of about 13.8 millimeters, as illustrated by arrow 36. However, substrates having other geometric shapes and sizes may be used depending upon the application and required surface area. Additionally, in some applications in which the first and second electrical devices 12, 14 are different electrical devices, the substrates 16, 18, 20 may not be identical in shape, size, or design and may have individually unique characteristics. The substrates 16, 18, 20 may be formed from a variety of materials which are rigid and provide flat surfaces 31, 32 suitable for receiving a deposition of metallic film. For example, the substrates 16, 18, 20 may be formed from materials such as ceramic, silicon nitride, aluminum nitride, beryllium oxide, alumina oxide, or diamond or diamondlike materials.

A metallic film 38 is deposited on the top surface 31 of the substrates 16, 18, 20 as illustrated in FIG. 1. The metallic film 38 is formed to include a device-receiving portion 40 and a terminal-receiving portion 42. The device portion 40 is deposited substantially in the center of the top surface 31 and has a rectangular top profile shaped to conform to the geometry of the bottom surface 44 of the first and second electrical devices 12, 14. In other embodiments, the device portion 40 may have other geometric shapes depending upon the geometry of the bottom surface 44 of the devices 32, 34. The terminal portion 42 extends away from the device portion 40 toward a width edge of the substrates 16, 18, 20. The metallic film 38 is formed from an electrically conductive material such as copper, copper alloy, aluminum, gold, silver, a conductive thick film ink, or conductive epoxies or the like. The film 38 is deposited on the surface 31 using techniques such as evaporation, printing, direct bonding, brazing, or plating. In some applications, for example applications using a silver film, the film 38 is deposited so as to form an "ultra-thick thick film" having a depth in the range of about 0.003 inches to about 0.006 inches. Depositing the film 38 as an "ultra-thick thick film" improves the current capabilities of the film 38 which may be an important aspect in some applications such as, for example, power modules.

Gate pin alignment pads 46 are also deposited on the top surface 31 of the substrates 16, 18, 20. The pads 46 are deposited toward a corner of the surface 31 and have a rectangular top profile shaped to conform to the rectangular profile of the gate pins 28, 30. The pad 46 is formed from an electrically conductive material such as copper, copper alloy, aluminum, gold, silver, a conductive thick film ink, or conductive epoxies or the like, but is electrically isolated from the film 38. The pad 46 is deposited on the surface 31 using the techniques used to deposit the film 38 such as printing, direct bonding or plating. Additionally, the pad 46 may be deposited so as to form an "ultra-thick thick film".

As illustrated in FIG. 2, a metallic film 48 is also deposited on the bottom surface 32 of the first and second substrates 16, 18. The film 48 is deposited substantially in the center of the bottom surface 32 and has an irregular top profile shaped to conform to the geometry of the top surface 50 of the electrical devices 12, 14. For example, the film 48 may be formed to provide electrical connections to some portions of the top surface 50 of the electrical device 12, 14 while isolating other portions such as, for example, a gate terminal in a MOSFET device. In particular, the film 48 is formed to provide electrical connections to the source/emitter terminal areas of the top surface 50 of the electrical devices 12, 14. The film 48 is formed from an electrically conductive material such as copper, copper alloy, aluminum, gold, silver, a conductive thick film ink, or conductive epoxies or the like. The film 48 is deposited on the surface 32 using techniques such as evaporation, printing, direct boding or plating. In some applications, the film 48 may be deposited to form an "ultra-thick thick film" as described in regard to the film 38 of FIG. 1.

The substrates 16, 18 also include a number of gate terminal pads 52 deposited on the bottom surfaces 32. In the embodiment illustrated in FIG. 2, two pads 52 are deposited on the bottom surface 32 of the substrates 16, 18. The pads 52 are deposited on the surface 32 in a position corresponding to the gate terminals of the top surface 50 of the electrical devices 12, 14. The number of gate terminal pads deposited on the surface 32 is application dependant and may be altered to conform to the type of electrical devices used in the application. The gate pads 52 are electrically coupled together to a gate pin pad 54 deposited on the bottom surface 32 of the substrates 16, 18. The pads 52, 54 are electrically coupled together through a gate resistor 56 which is also coupled to the bottom surface 32 of the substrates 16, 18 using a surface mounting technique. The gate pin pad 54 has a rectangular top profile shaped to conform to the rectangular profile of the gate pins 28, 30. The gate pin pad 54 is deposited on the surface 32 toward a corner of the substrate 16 in a position that is directly above the gate pad 46 deposited on the surface 31 of substrate 18 when the substrates 16, 18, 20 are positioned in juxtaposed relationship relative to each other. Similarly, the gate pin pad 54 is deposited on the surface 32 toward a corner of the substrate 18 in a position that is directly above the gate pad 46 deposited on the surface 31 of substrate 20 when the substrates 16, 18, 20 are positioned in juxtaposed relationship relative to each other. The pads 52, 54 are formed from an electrically conductive material such as copper, copper alloy, aluminum, gold, silver, a conductive thick film ink, or conductive epoxies or the like, but are electrically isolated from the film 48. The pads 52, 54 are deposited on the surface 32 using the techniques used to deposit the film 38 such as printing, direct bonding or plating. Additionally, the pads 52, 54 may be deposited to form an "ultra-thick thick film". Although the embodiment illustrated in FIGS. 1 and 2 includes a number of gate resistors 56, in some applications, the gate resistors 56 may not be used. Further, in some applications additional resistors or other electrical components, for example diodes, thermistors, and capacitors, may be coupled to the substrate 16, 18, 20 and electrically coupled to the devices 32, 34.

A number of terminal alignment pads 58 are also deposited on the bottom surface 32 of the substrates 16, 18. The pads 58 are deposited on the surface 32 in a position that is toward a width end of the substrates 16, 18 and is horizontally parallel to the gate pin pad 54. The alignment pads 58 have rectangular top profiles shaped to conform to the rectangular profile of the terminals 22, 24, 26. The pads 58 are formed from an electrically conductive material such as copper, copper alloy, aluminum, gold, silver, a conductive thick film ink, or conductive epoxies or the like, but are electrically isolated from each other and other pads and films deposited on the surface 32. The pads 58 are deposited on the surface 32 using the techniques used to deposit the film 26 such as evaporation, printing, direct bonding or plating. Additionally, the pads 58 may be deposited so as to form an "ultra-thick thick film".

The metallic film 38 deposited on the top surface 31 of the substrates 16, 18 includes a plurality of vias 60. The vias 60 are cylindrical holes that extend through the film 38, the substrates 16, 18, and the metallic film 48 deposited on the bottom surface of the substrates 16, 18. The vias 60 provide an electrical connection between the films 38, 48. In some applications a metallic structure, such as a ball bearing or cylindrical sleeve, is inserted in the vias 60. The metallic structure improves the electrical coupling of the substrates 16, 18 when the solder alloy is applied to the substrates 16, 18 during the reflow process. In other applications, a vacuum is used to pull the solder alloy through the vias 60 so as to establish an electrical connection between the substrates 16, 18. Additionally, in some applications a conductive thick film is used to provide the electrical connection between the substrates 16, 18.

The electrical switch circuit 10 includes a number of terminals used to electrically power and control the circuit 10. The first power terminal 22 is coupled to terminal-receiving portion 40 of the metallic film 38 deposited on the top surface 20 of the first substrate 16. The second power terminal 24 is coupled to the terminal alignment pads 58 deposited on the bottom surface 32 of the second substrate 18 and to the terminal receiving-portion 40 of the metallic film 38 deposited on the top surface 20 of the third substrate 20. The output terminal 26 is coupled to the terminal alignment pads 58 deposited on the bottom surface 32 of the first substrate 16 and to the to the terminal-receiving portion 40 of the metallic film 38 deposited on the top surface 20 of the second substrate 18. The terminals 22, 24, 26 are electrically and physically coupled to the portions 40 by a solder alloy during the reflow process. The terminals 22, 24, 26 are formed from a suitable electrically conductive material such as, for example, copper. The terminals 22, 24, 26 have a flat, rectangular base portion 62 and a number of rectangular prongs 64 that extend out from the base portion 62. The number of prongs 64 may be altered depending upon the application. The prongs 64 are used to improve the alignment of the terminals 22, 24, 26 on the receiving-portion 40 during the reflow process. The base portion 62 of the terminals 22, 24, 26 is designed to be relatively thin and wide so as to improve the inductance and current capabilities of the terminals 22, 24, 26.

The first gate pin 28 is coupled to the gate pin alignment pad 46 deposited on the top surface 31 of the second substrate 18 and to the gate pin pad 54 deposited on the bottom surface 32 of the first substrate 16. The second gate pin 30 is coupled to the gate pin alignment pad 46 deposited on the top surface 31 of the third substrate 20 and to the gate pin pad 54 deposited on the bottom surface 32 of the second substrate 18. The pins 28, 30 are formed from a suitable electrically conductive material such as, for example, copper. The pins 28, 30 have a rectangular top profile similar to the prongs 64 of the terminals 22, 24, 26.

Figure 3:
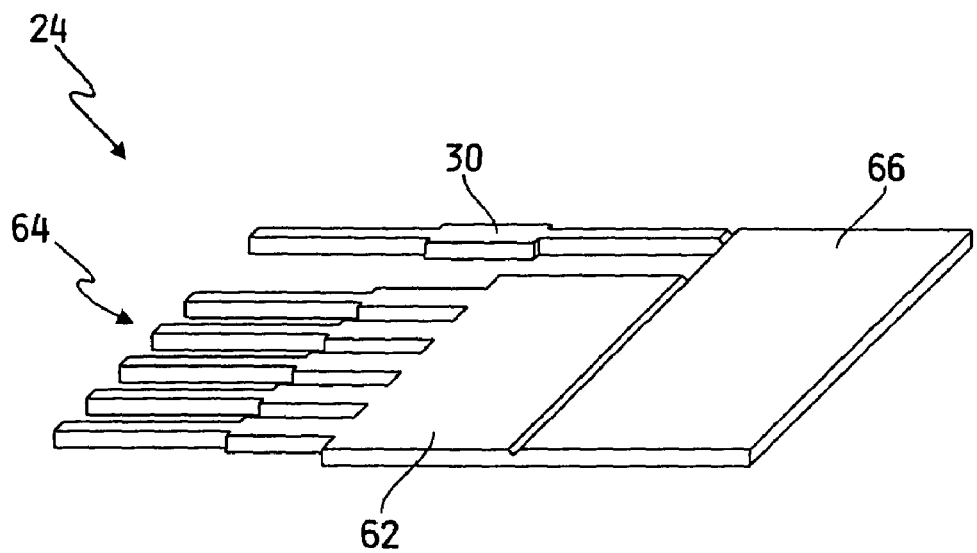
FIG. 3 is a diagrammatic perspective view of a terminal of the electrical switch circuit of FIG. 1.
Figure 4:
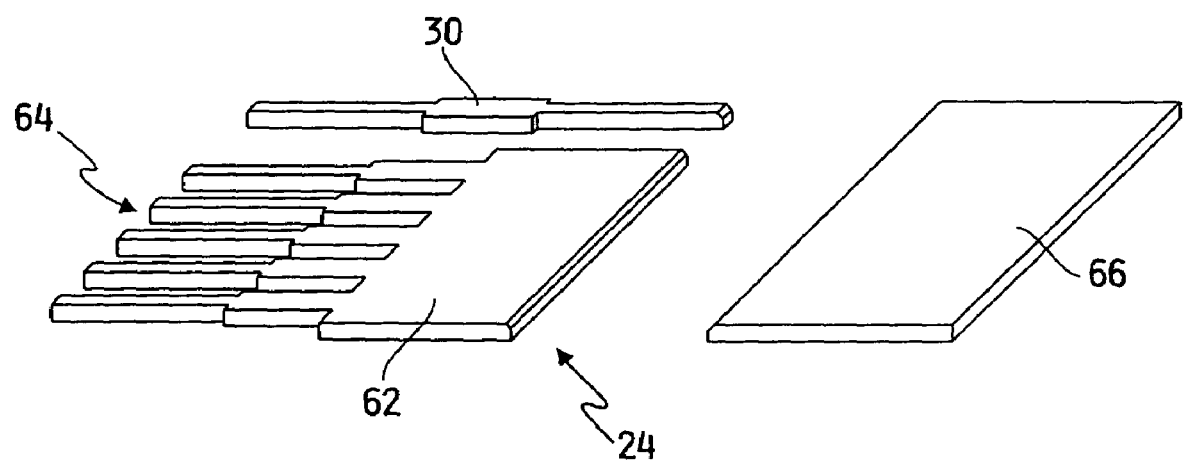
FIG. 4 is a diagrammatic perspective view of the terminal of FIG. 3 with a tab portion of the terminal removed.

In some embodiments, the terminals 24, 26 and the gate pins 28, 30 may be coupled together, respectively, by a metallic tab portion 66 as illustrated in FIG. 3. The tab portion 66 improves the alignment of the terminals 24, 26 and the pins 28, 30 during the reflow process by providing a larger mass to stabilize the terminals 24, 26 and the relatively thin gate pins 28, 30. The tab portion 66 is formed from the same material as the terminals 24, 26 and the gate pins 28, 30 such as, for example, copper. After the terminals 24, 26 and the gate pins 28, 30 have been coupled to the substrates 16, 18, 20 by the reflow process, the tab portion 66 may be removed from the terminals 24, 26 and the gate pins 28, 30 as illustrated in FIG. 2. The tab portion 66 may be removed by gently bending the tab portion 66 back and forth or by cutting the portion 66 from the terminals 24, 26 and the pins 28, 30.

Figure 6:
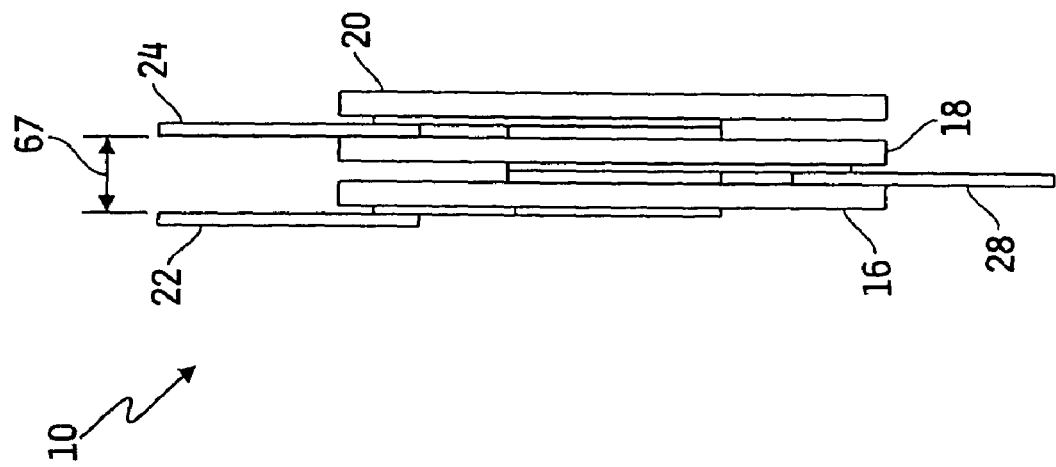
FIG. 6 is a side plan view of the electrical switch circuit of FIG. 1.
Figure 5:
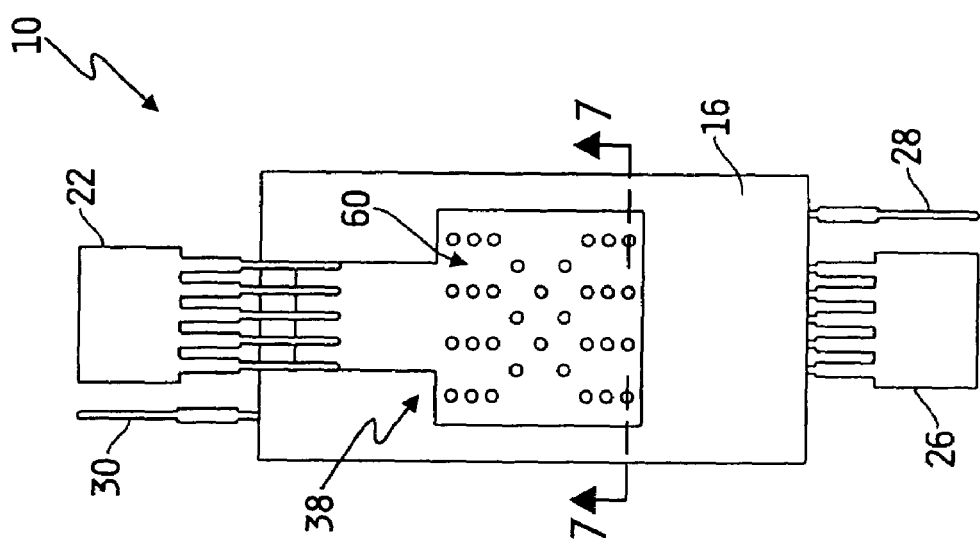
FIG. 5 is a top plan view of the electrical switch circuit of FIG. 1.

The vertical laminated switch circuit 10 is manufactured by stacking the substrates 16, 18, 20, devices 12, 14, terminals 22, 24, 26, and gate pins 28, 30 in a vertical column and subjecting the column to a soldering reflow process. A solder film is first applied to the wetable areas of the devices 12, 14, the films 38, 48, and pads 46, 52, 54, 58 deposited on the surfaces 31, 32. The devices 12, 14 are positioned on the device-receiving portions 40 of the films 38 of the substrates 18, 20. The terminals 22, 24, 25 are position on the terminal-receiving portions 40 of the films 38 and the gate pins 28, 30 are positioned on the gate pin pads 54. The substrates 16, 18, 20 are positioned in juxtaposed relationship relative to each other to form a vertical stack as illustrated in FIGS. 5 and 6. The switch circuit 10 is subsequently subjected to a soldering reflow process to form the physical and electrical connections of the circuit 10. During the reflow process, the switch circuit 10 utilizes the cooperation of the alignment pads and the cohesion effect of the solder alloy to self-align the components of the circuit 10. For example, the metallic film 48 is shaped to conform to the geometry of the top surface 50 of the electrical devices 32, 34 so as to facilitate the self-aligning of the electrical devices 32, 34 during the reflow process. Similarly, the terminal alignment pads 58 facilitate the self-aligning of the terminals 24, 26. The alignment pads 58 are separately isolated from each other and other films so that the prongs 64 of the terminals 24, 26 will be pulled into conformity by the cooperation of the pads 58 and the cohesion effect of the solder alloy.

Figure 7:
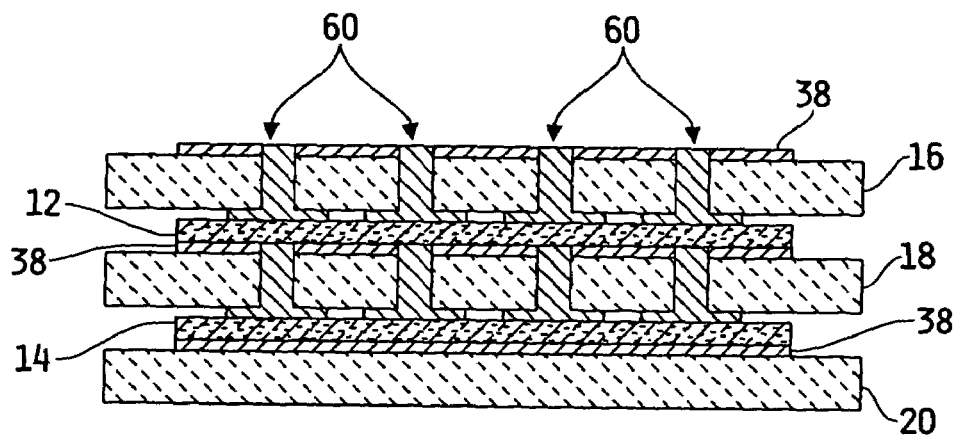
FIG. 7 is a cross-sectional view of the electrical switch of FIG. 6 viewed along section lines 7-7.

During the reflow process, the first electrical device 12 and the second electrical device 14 are electrically coupled to each other by the vias 60. The vias 60 provide the electrical connection between the substrates 16, 18, 20. As illustrated in FIG. 7, the metallic film 38 deposited on the top surface 31 of the first substrate 16 is coupled through the vias 60 to the metallic film 48 deposited on the bottom surface 32 of the first substrate 16 and the drain/collector terminals of the first electrical device 12. Similarly, the source/emitter of the first electrical device 12 and the film 38 deposited on the top surface 31 of the second substrate 18 is coupled through the vias 60 to the film 48 deposited on the bottom surface 32 of the second substrate 18 and the source/emitter terminals of the second electrical device 14. The vias 60 allow the devices 12, 14 and substrates 16, 18, 20 to be stacked in a vertical column while providing electrical connection between the devices 12, 14.

After the vertical laminated switch circuit 10 has undergone the reflow process, the first terminal 22 and the second terminal 24 are vertically above each other. In particular, the terminals 22, 24 are separated by a relatively small distance. In the embodiment illustrated in FIG. 6, the terminals 22, 24 are separated by a distance of about 3.06 millimeters, however, the separation distance of the terminals 22, 24 may vary according to the application. Vertically positioning the terminals 22, 24 over each at a relatively small distance apart improves the inductance of the switch circuit 10.

Although the embodiment illustrated in FIGS. 1-7 show a switch circuit 10 having only two devices 12, 14, it is contemplated that in some applications the switch circuit 10 may have more than two electrical devices 12, 14. The substrates 16, 18, 20 may be formed with a greater width so as to accommodate multiple electrical devices on a single substrate. Such embodiments allow multiple devices to be coupled in parallel so as to improve the overall current handling capabilities. Other electrical devices such as, for example, diodes and thermistors may also be coupled to the substrates. Additionally, in some applications, the vertical laminated switch circuit may include more than three substrates 16, 18, 20. Further, the various electrical devices may be electrically coupled so as to form one of a number of electrical circuits including, for example, full wave inverters, full H-bridges, choppers, and other electrical circuits.

Figure 8:
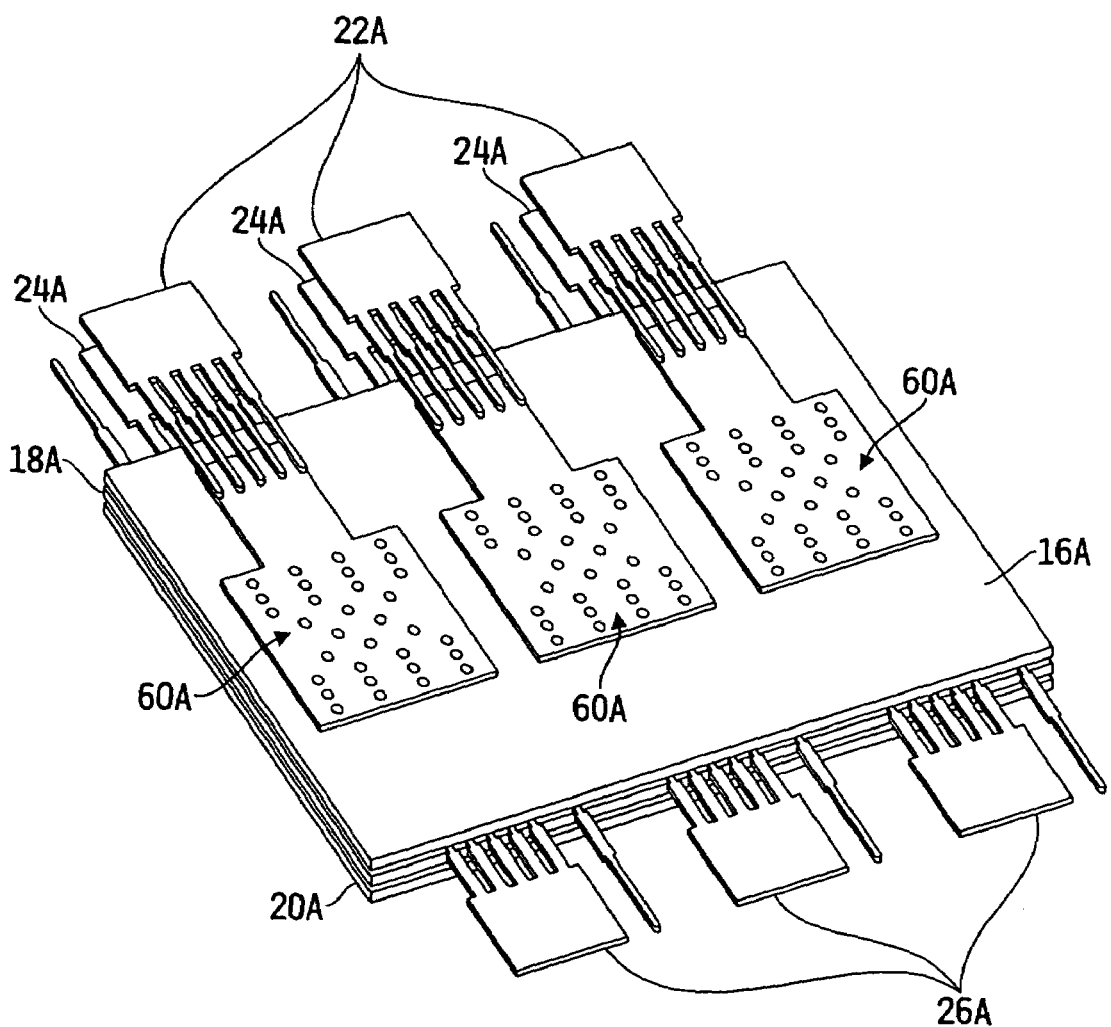
FIG. 8 is a top diagrammatic perspective view of an alternative embodiment of an electrical switch circuit.
Figure 10:
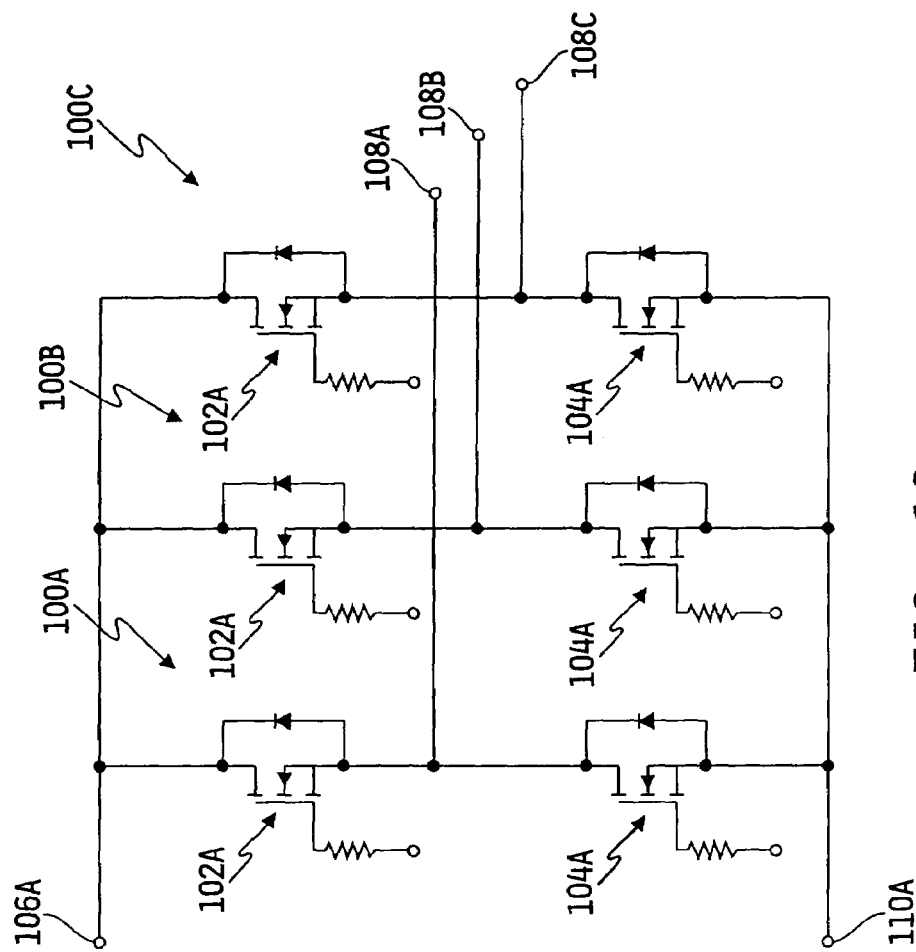
FIG. 10 is an electrical schematic of an alternative prior art electrical switching circuit.
Figure 9:
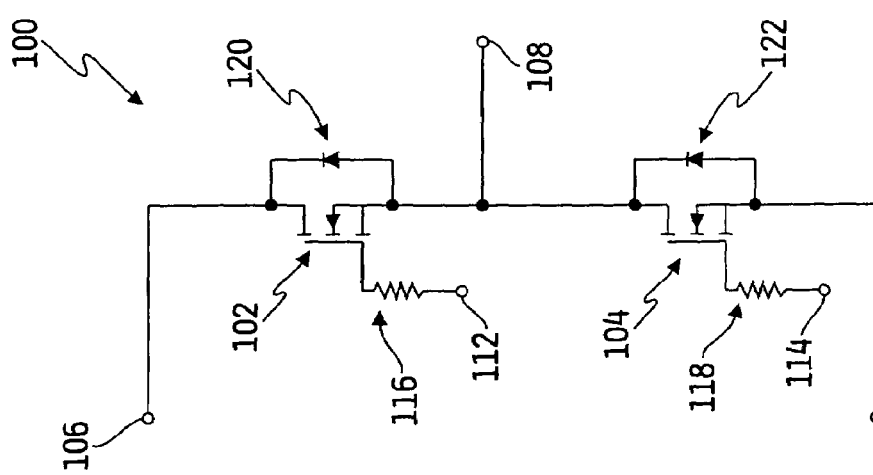
FIG. 9 is an electrical schematic of a prior art electrical switching circuit.

In one embodiment using wider substrates 16A, 18A, 20A, a three-phase half-bridge inverter circuit 80 is formed from combining three of the vertical laminated circuits 10 as illustrated in FIG. 8. The inverter circuit 80 includes three transistor pairs (not shown), for example Insulated Gate Bipolar Transistors or Metal Oxide Semiconductor Field-Effect Transistors, electrically coupled in a half-bridge configuration as schematically illustrated in FIG. 10. Each transistor pair is electrically coupled together and physically coupled to the substrates 16A, 18A, 20A in a manner substantially similar to the electrical devices 12, 14 and substrates 16, 18, 20 described in regard to FIGS. 1-7. In particular, the first, third and fifth transistors are coupled to the first substrate 16A and the second substrate 18B. The second, fourth, and sixth transistors are coupled to the second substrate 16A and the third substrate 16C. The first and second transistors are electrically coupled to each other through the vias 60A in the substrates 16A, 20A in a half-bridge electrical configuration. Similarly, the third and fourth transistors are electrically coupled to each other through the vias 60A in the substrates 16A, 20A in a half-bridge electrical configuration. Further, the fifth and sixth transistors are electrically coupled to each other through vias 60A in the substrates 16A, 20A in a half-bridge electrical configuration. The substrates 16A, 18A, 20A are positioned in juxtaposed relationship relative to each other so as to form a vertical stack. The first, third, and fifth transistors are positioned between the first substrate 16A and the second substrate 18A. The second, fourth, and sixth transistors are positioned between the second substrate 18A and the third substrate 20A. Three positive supply terminals 22A are coupled to the first substrate 16A and electrically coupled to the first, third, and fifth transistors, respectively. Three negative supply terminals 24A are coupled to the second substrate 18A and electrically coupled to the second, fourth, and sixth transistors. Three output terminals 26A are coupled to the first and second substrates 16A, 18A and electrically coupled to the first and second transistors, the third and fourth transistors, and the fifth and sixth transistors, respectively. The inverter circuit 80 also includes three gate pins coupled to the first and second substrates 16A, 18A and electrically coupled to the first, third, and fifth transistors, separately. Additionally, the inverter circuit 80 includes a further three gate pins coupled to the second and third substrates 18A, 20A and electrically coupled to the second, fourth, and sixth transistors, separately. Similar to the switch circuit 10, the physical and electrical connections of the inverter circuit 80 may be formed by one of a number of attachment processes such as a soldering reflow process. A half-wave, three phase power single is formed on the three output terminals 26A by applying a suitable potential across the supply terminals and applying a trigger voltage to the gate pins in an alternating pattern. Another circuit 80 may be used to produce a full-wave, three phase power single by applying a suitable negative potential across the power terminals. Additionally, in some applications, the number of transistors in the inverter circuit 80 may be increased so as to increase the drive capability of the circuit 18 or to form a complete full-wave, three phase power inverter utilizing only three substrates.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

The invention claimed is:

1. An electrical switch circuit comprising:
a first, second, and third ceramic substrate positioned in juxtaposed relationship with each other;
a first electrical device coupled to the first and second substrates and positioned there between; and
a second electrical device coupled to the second and third substrates and positioned there between, the second electrical device being electrically coupled to the first electrical device;
wherein the electrical switch circuit further includes a first, second, and third terminal, the first terminal coupled to the first substrate and electrically coupled to the first electrical device, the second terminal coupled to the first and second substrates and electrically coupled to the first and second electrical devices, the third terminal coupled to the second and third substrates and electrically coupled to the second electrical device.

2. The electrical switch circuit of claim 1, wherein the first, second, and third terminals have a rectangular cross-section.

3. The electrical switch circuit of claim 1, wherein the first and third terminals are positioned substantially in registry with each other.

4. The electrical switch circuit of claim 1, further including a first and second resistor, the first resistor coupled to the first substrate and electrically coupled to the first electrical device, the second resistor coupled to the second substrate and electrically coupled to the second electrical device.

5. The electrical switch circuit of claim 1, wherein the first and second electrical devices include transistors.

6. The electrical switch circuit of claim 5, wherein the transistors include insulated gate bipolar transistors.

7. The electrical switch circuit of claim 5, wherein the transistors include metal oxide semiconductor field-effect transistors.

8. The electrical switch circuit of claim 5, further including a first and a second gate pin, the first gate pin coupled to the first and second substrates and electrically coupled to the first transistor, the second gate pin coupled to the second and third substrates and electrically coupled to the second transistor.

9. The electrical switch circuit of claim 5, wherein the first and the second transistors are electrically coupled in a half-bridge electrical configuration.

10. The electrical switch circuit of claim 1, wherein the first device includes a diode.

11. The electrical switch circuit of claim 1, wherein the second device includes a diode.

12. The electrical switch circuit of claim 1, wherein the first and the second substrates include a plurality of vias.

13. The electrical switch circuit of claim 12, further including a conductive material positioned in the vias of the first and second substrates.

14. The electrical switch circuit of claim 1, wherein the first, second, and third substrates include an electrically conductive film formed on a surface of the first, second, and third substrates, the electrically conductive metal film facilitating electrical coupling between the first and second electrical devices.

15. The electrical switch circuit of claim 14, wherein the electrically conductive film is an electrically conductive thick film ink.

16. The electrical switch circuit of claim 14, wherein the electrically conductive film is a copper film.

17. The electrical switch circuit of claim 14, wherein the electrically conductive film is an aluminum film.

18. The electrical switch circuit of claim 14, wherein the electrically conductive film is an electrically conductive epoxy.

19. The electrical switch circuit of claim 14, wherein the electrically conductive film is formed using any of an evaporation process, a printing process, a sputtering process, and a brazing process.

20. The electrical switch circuit of claim 14, wherein the top planar geometry of the electrically conductive film is a substantial mirror image of the top planar geometry of a top surface of the first and second electrical devices.

21. A three phase inverter comprising:
a first, second, and third ceramic substrate positioned in juxtaposed relationship relative to each other;
a first and second transistor, the first transistor being coupled to the first and second substrates and positioned there between, the second transistor being coupled to the second and third substrates and positioned there between, the first and second transistors being electrically coupled together in a half-bridge electrical configuration;
a third and fourth transistor, the third transistor being coupled to the first and second substrates and positioned there between, the fourth transistor being coupled to the second and third substrates and positioned there between, the third and fourth transistors being electrically coupled together in a half-bridge electrical configuration; and
a fifth and sixth transistor, the fifth transistor being coupled to the first and second substrates and positioned there between, the sixth transistor being coupled to the second and third substrates and positioned there between, the fifth and sixth transistors being electrically coupled together in a half-bridge electrical configuration.

* * * * *